United States Patent [19]
Gardner et al.

[11] Patent Number: 5,885,501
[45] Date of Patent: Mar. 23, 1999

[54] PROCESS FOR PREPARING DIMENSIONALLY STABILIZED BIAXIALLY STRETCHED THERMOPLASTIC FILM

[75] Inventors: Donna Kristine Gardner; Karl Paul Paoletti, both of Grove City; Ramesh Mohanlal Gohil, Circleville; Albert White Forrest, Jr., Chillicothe, all of Ohio

[73] Assignee: E. I. du Pont de Nemours and Company, Wilmington, Del.

[21] Appl. No.: 881,229

[22] Filed: Jun. 24, 1997

[51] Int. Cl.⁶ ..................................................... B29C 55/16
[52] U.S. Cl. ................. 264/216; 264/235.8; 264/342 RE
[58] Field of Search ................................ 264/216, 235.8, 264/342 RE

[56] References Cited

U.S. PATENT DOCUMENTS

| | | | |
|---|---|---|---|
| 3,150,433 | 9/1964 | Kampf | 26/73 |
| 4,985,537 | 1/1991 | Utsumi et al. | 264/235.8 X |
| 5,051,225 | 9/1991 | Hommes et al. | 264/288.4 |
| 5,429,785 | 7/1995 | Jolliffe | 264/216 |

*Primary Examiner*—Leo B. Tentoni

[57] ABSTRACT

An improved process for preparing a biaxially stretched thermoplastic film, such as polyethylene naphthalate (PEN) or polyethylene terephthalate (PET) film, having low thermal shrinkages by simultaneous biaxial stretching of the film in a tenter frame using linear electrical motors to drive the tenter clips. The film is relaxed in the machine direction (MD) and the transverse direction (TD) by converging the paths of the tenter clips and decelerating the tenter clips during heat-setting to provide film having tailored levels of MD and TD shrinkages.

4 Claims, 1 Drawing Sheet

PROCESS FOR PREPARING DIMENSIONALLY STABILIZED BIAXIALLY STRETCHED THERMOPLASTIC FILM

BACKGROUND OF THE INVENTION

1. Field of the Invention

The present invention is directed to a process for preparing a dimensionally stable, biaxially stretched thermoplastic film, such as polyethylene terephthalate (PET) or polyethylene naphthalate (PEN), having low thermal shrinkage.

2. Description of the Prior Art

Commercial applications exist which require dimensionally stable thermoplastic films, such as polyethylene naphthalate (PEN) or polyethylene terephthalate (PET), having low thermal shrinkage. Examples include flexible printed circuitry, membrane touch switches, high temperature labels and certain types of pressure sensitive tapes. Current commercial thermoplastic film stabilization techniques, however, have disadvantages due to the added cost associated with additional processing steps and/or equipment, increased scrap generation with off-line equipment, limited flexibility of the extent of machine direction (MD) relaxation and less control of transverse direction (TD) tension and relaxation while imparting MD relaxation.

U.S. Pat. No. 3,150,433 discloses a simultaneous biaxial film stretcher wherein the tenter clips are driven mechanically by a large screw with varying pitch along the clip path, thereby allowing introduction of MD and TD relaxation during heat-setting of the film. However, the MD stretch ratio and MD relaxation are pre-determined by the screw pitch and cannot be readily manipulated to impart varying MD relaxation.

U.S. Pat. No. 5,429,785 discloses a process for preparing an ultra-thin, simultaneous biaxially stretched polyester film in a tenter frame using linear electric motors by heating the film to the film orientation temperature in the tenter frame prior to stretching and maintaining the film within the film orientation temperature range using radiant heaters while simultaneously stretching and subsequently heat-setting the film in the tenter frame at elevated temperatures. The patent is silent regarding relaxation of the film in the MD and TD directions to lower thermal shrinkages.

Other in-line stabilization techniques include relaxing the film by passing it through a nip formed by two rolls (at or above the glass transition temperature) which operate at different speeds and by heating under low tension in an air flotation oven. Since the film is not restrained in the tenter clips during these relaxation processes, there is less control of transverse direction tension during relaxation. In addition, both of these methods require additional processing equipment which increases cost.

Additional film stabilization units are also available as off-line processing units. While films with low thermal shrinkages can be obtained, this introduces the added cost of an additional processing step. Also, during the start-up and shut-down of this equipment, scrap film is generated thereby lowering production yields.

Accordingly, there is a need for a process for preparing biaxially stretched thermoplastic films, such as polyethylene naphthalate or polyethylene terephthalate film, which provides greater flexibility and control of the amount of MD and TD film relaxation thereby producing films with low MD and TD thermal shrinkages.

SUMMARY OF THE INVENTION

The present invention relates to an improved process for preparing a dimensionally stable, biaxially stretched thermoplastic film including the steps of:

(a) casting a molten thermoplastic polymer onto a quenching surface and cooling the polymer to form a self-supporting film;

(b) transporting the film into a tenter frame and gripping the edges of the film with tenter clips driven by linear electric motors;

(c) preheating the film to an orientation temperature range in a preheating section of the tenter frame;

(d) simultaneously stretching the film biaxially in both the machine direction (MD) and transverse direction (TD) to form a biaxially stretched thermoplastic film; and (e) heat-setting the film, wherein the improvement comprises simultaneously or sequentially relaxing the film in the MD and TD directions by converging the paths of the tenter clips and decelerating the tenter clips during and/or after heat-setting.

DETAILED DESCRIPTION OF THE INVENTION

Figure 1:
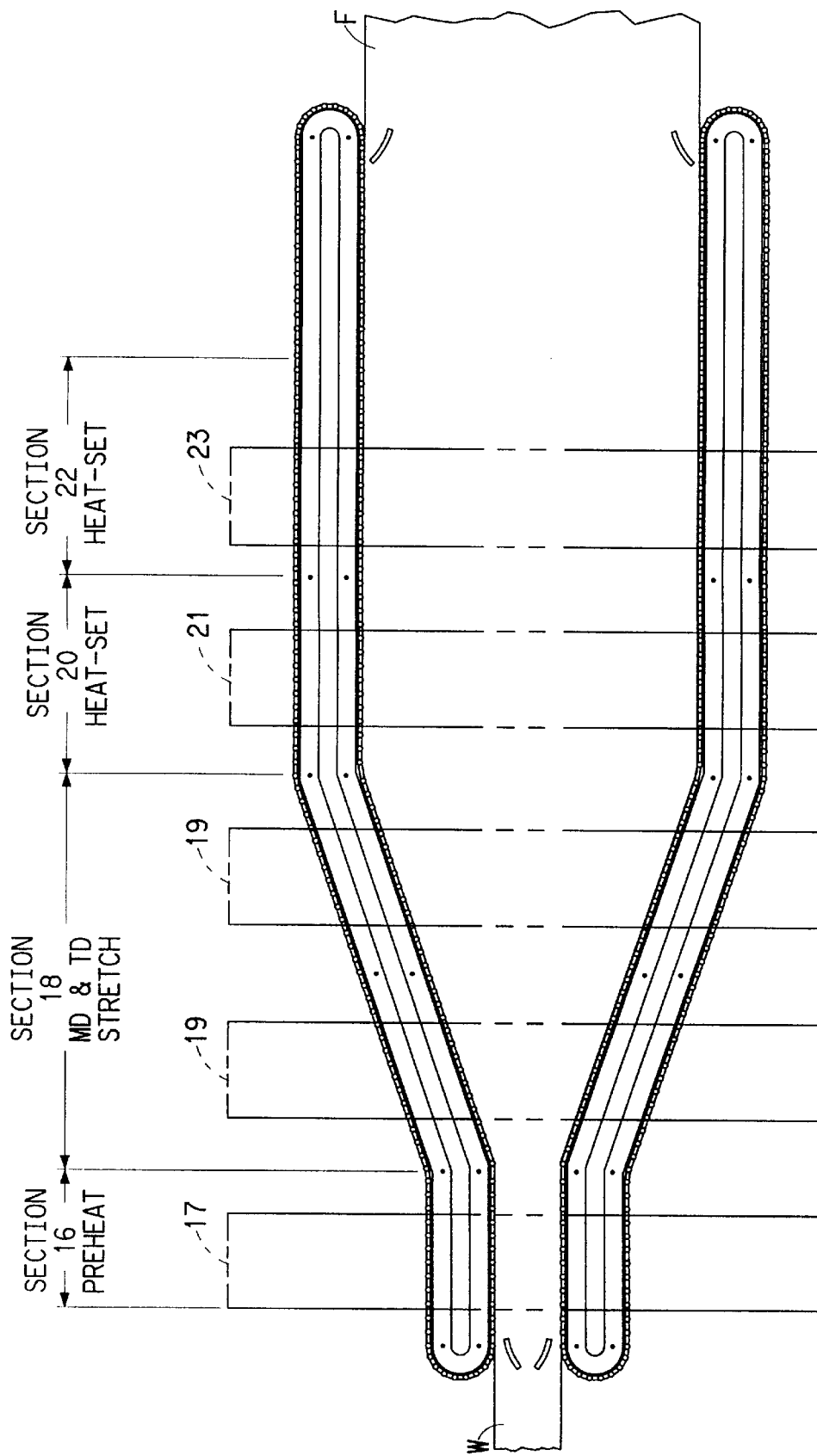
FIG. 1 is a schematic top plan view of a tenter frame used to simultaneously biaxial stretch a thermoplastic film according to the invention.

The present invention relates to an improved process for preparing a biaxially stretched thermoplastic film, such as polyethylene naphthalate (PEN) or polyethylene terephthalate (PET) film, having low thermal shrinkages by simultaneous biaxial stretching of a thermoplastic film in a tenter frame, wherein the tenter clips are driven by linear electrical motors substantially as described by Hommes et al in U.S. Pat. No. 5,051,225, followed by TD and MD relaxation during heat-setting while the film is restrained in the tenter clips. The tenter clips are accelerated in the film stretching section of the tenter frame to introduce MD orientation and subsequently decelerated in or after the heat-setting section of the tenter frame to introduce MD relaxation. Since the clip speed is electronically controlled, the amount of MD relaxation can easily be varied. As in a conventional tenter frame, the amount of TD orientation and relaxation can be controlled by the mechanical positioning of the rails. The process allows the introduction of both MD and TD relaxation during processing while the film is still grasped by the tenter clips. Advantageously, the process provides greater flexibility and control over the amount of MD and TD relaxation to which the film is subjected and, therefore, can be used to produce thermoplastic films having tailored levels of MD and TD thermal shrinkages.

Suitable thermoplastic films prepared according to the invention include polyesters containing as the major acid component an aromatic dicarboxylic acid (or the lower alkyl ester thereof) and as the major glycol component an alkylene glycol. Examples of the aromatic dicarboxylic acid include but are not limited to terephthalic acid, isophthalic acid, naphthalenedicarboxylic acid, diphenoxyethanedicarboxylic acid, diphenyletherdicarboxylic acid, diphenylsulfodicarboxylic acid and diphenylketonedicarboxylic acid. Most preferred are terephthalic acid or naphthalenedicarboxylic acid. The preferred alkylene glycol is ethylene glycol. Suitable copolymerizable components which may be added to optimize properties of the desired films, as is well known in the art, include diols such as diethylene glycol. propylene glycol or neopentylglycol; aromatic diacid components such as phthalic acid and isophthalic acid; and aliphatic diacid components such as sebacic acid and adipic acid. Polyethylene terephthalate (PET) or polyethylene-2,6-naphthalate (PEN) are especially suitable for the film produced by this process. The process is also applicable to polyester copolymers of PET and PEN, copolymers comprising more than 70% by weight of either PET or PEN, and polymer blends formed by combination of suitable polymers providing that the blend exhibits orientation characteristics typical of PET and PEN during the film forming process.

The polymer may also contain insoluble (inorganic or organic) particles internally precipitated or externally added, as is well known in the art, to serve as a lubricant facilitating film handling including winding of the film roll.

A preferred example of a film produced by the process of the invention is a biaxially stretched polyethylene naphthalate film which, when relaxed from 2 to 5% in both the MD and TD, has a thermal shrinkage of less than 0.30% in both MD and TD after exposure to 200° C. for 30 minutes unrestrained. A preferred biaxially stretched PET film prepared according to the invention, when relaxed from 2 to 5% in both the MD and the TD, has a thermal shrinkage of less than 0.20% in both the MD and TD after exposure to 150° C. for 30 minutes.

Referring to the drawing, FIG. 1 shows a tenter frame stretcher 11 suitable for simultaneous biaxial stretching of a thermoplastic film according to the present invention.

Initially, a molten thermoplastic polymer is melt-extruded through a slit orifice of a die and cast onto the quenching surface of a cooled, rotating quench drum at a temperature below the glass transition temperature to produce an amorphous self-supporting film W.

The cast film W is stripped from the quench drum and transported to tenter frame 11. At the entrance to tenter frame 11, the edges of the film are gripped by tenter clips driven by linear electrical motors, the speed of which are electronically controlled. Each tenter clip grips a small length of film with longer lengths of non-gripped areas between each clip. This allows the film to freely stretch as the tenter clips are subsequently accelerated in stretching section 18.

The tenter clips are then moved in a parallel path through preheat section 16 where the film is heated using radiant heaters 17 to a temperature at which the film can be stretched and oriented. For PEN film the orientation temperature range is typically from 115° to 165° C., preferably from 125° to 150° C., while for PET film the orientation temperature range is typically from 80° to 120° C., preferably from 90° to 100° C.

After the film is heated to within the orientation temperature range, the film is moved into stretching section 18 where it is simultaneously biaxially stretched in the machine direction (MD) and transverse direction (TD) using radiant heaters 19. The path of the clips is diverged and opposed pairs of clips are accelerated causing the distance between the clips in the machine direction (MD) to increase. Typically, the film is stretched from 2.5 to 5.0 times, preferably from 3.0 to 3.5 times, its original dimensions in each direction. Stretching temperatures typically range from 80° to 120° C. for PET and 115° to 165° C. for PEN.

After film W has been biaxially stretched in stretching section 18, it is moved into heat setting sections 20 and 22 of the tenter frame and heated using radiant heaters 21 and 23 to dimensionally stabilize the film. For PEN film the heat setting temperature typically ranges from 185° to 260° C., preferably from 210° to 245°, while for PET film the heat setting temperature typically ranges from 185° to 230° C., preferably from 200° to 230° C. During the initial stage of heat-setting in section 20, the paths of the clips are parallel and the clips move at a constant velocity. While the film is still restrained in the clips, the path of the clips converge and the clips are subsequently decelerated in section 22 thus introducing TD and MD relaxation. The TD and MD relaxation can be introduced simultaneously or sequentially. The amounts of MD and TD relaxation to which the film is subjected and the temperature at which the film is relaxed control the thermal shrinkage or dimensional stability of the thermoplastic film. Accordingly, by changing the levels of MD and TD relaxation and the relaxation temperature, biaxially stretched films having different levels of thermal shrinkage can be produced.

Finally, the stretched and heat-set film F is cooled and subsequently disengaged from the tenter clips, the edges are trimmed off and the central film is wound into a roll.

The film F produced by the invention, is extremely thin having a thickness ranging from 3 to 200 micrometers, preferably from 4 to 125 micrometers.

The following examples illustrate the preparation of PEN and PET films according to the invention having tailored levels of MD and TD shrinkage produced by changing the amounts of MD and TD relaxation.

EXAMPLES 1 AND 2

These examples compare the shrinkage properties of PEN films produced using different levels of MD relaxation. All other process conditions were identical.

PEN films having a final thickness of 1 mil were produced according to the previous general description.

The clip paths were diverged in section 18 of tenter frame 11 (see FIG. 1) to stretch the film by a factor of 3.26 in the transverse direction. At the same time, the tenter clips were accelerated to stretch the film by a factor of 3.20 in the machine direction. The clip path was parallel and the clip velocity was constant through heat-setting section 20. The clip path was then converged in heat-setting section 22 so that the resultant film had a final TD stretch ratio of approximately 3.18. At the same time the velocity of the clips was decreased thus introducing MD relaxation.

The films were heat-set and relaxed at a temperature of 235° C. The percentage of MD relaxation introduced into the films for each of these examples are reported in Table 1.

The dimensional stability or thermal shrinkage of these films was measured and is reported in Table 1. This measurement was made by measuring the amount of shrinkage of a 10 inch by 10 inch square sample of the film after exposure to the given temperature for 30 minutes. The results show that by controlling the amount of MD relaxation to which the PEN film was subjected, a film with a desired level of shrinkage can be produced.

TABLE 1

| Example | Initial MD Stretch Ratio | % MD Relaxation | Final MD Stretch Ratio | 200° C. Shrinkage (MD/TD) | 230° C. Shrinkage (MD/TD) |
|---|---|---|---|---|---|
| Control | 3.20 | 0 | 3.20 | 1.79%/0.65% | 3.29%/1.41% |
| 1 | 3.20 | 2.5 | 3.12 | 0.88%/0.47% | 2.16%/1.24% |
| 2 | 3.20 | 5.0 | 3.04 | 0.03%/0.30% | 0.58%/0.73% |

EXAMPLES 3 AND 4

These examples compare shrinkage properties of PEN films produced using different levels of both MD and TD relaxation during heat set. All other process conditions were identical.

PEN films having a final thickness of 1 mil were produced according to the previous description. The clip paths were diverged in section 18 of tenter frame 11 (see FIG. 1) to stretch the film by 3.56 in the transverse direction. At the same time, the clips were accelerated to stretch the film by 3.30 in the machine direction. The clip path was parallel and the clip velocity was constant through heat-setting section 20. The clip path was then converged in heat-setting section 22 to relax the film in TD. At the same time, the velocity of the clips was decreased thus introducing MD relaxation. The films were heat-set and relaxed at a temperature of 230° C. For these films, differing levels of TD and MD relaxation were introduced. The percentages of TD and MD relaxation used in these example films are reported in Table 2.

The dimensional stability of these PEN films is also reported in Table 2 and illustrate that by manipulating the amounts of TD and MD relaxation, the dimensional stability of the PEN film can be tailored to a desired level.

TABLE 2

| Example | Initial TD Stretch Ratio | % TD Relaxation | Final TD Stretch Ratio | Initial MD Stretch Ratio | % MD Relaxation | Final MD Stretch Ratio | 150° C. Shrinkage (MD/TD) (%*) | 200° C. Shrinkage (MD/TD) (%*) |
|---|---|---|---|---|---|---|---|---|
| 3 | 3.56 | 2.2 | 3.48 | 3.30 | 2.4 | 3.22 | 0.43/−0.08 | 0.77/−0.10 |
| 4 | 3.56 | 4.5 | 3.40 | 3.30 | 4.8 | 3.14 | 0.19/−0.25 | 0.58/−0.50 |

*(−) indicates expansion

EXAMPLES 5 THROUGH 9

These examples compare shrinkage properties of PET films produced using different levels of MD and TD relaxation and different relaxation temperatures. All other processing conditions are identical.

PET films having a final thickness of 1 mil were produced according to the previous description. The clip paths were diverged in section 18 of the tenter frame 11 (see FIG. 1) to stretch the film by 3.5 in the transverse direction. At the same time, the clips were accelerated to stretch the film by 3.50 in the machine direction. The clip path was parallel and the clip velocity was constant through heat-setting section 20. The temperature was adjusted to the desired value for relaxation and the clip path was converged in section 22 to relax the film in the TD. At the same time, the velocity of the clips was decreased thus introducing MD relaxation. For these films, differing levels of TD and MD relaxation were introduced. The percentages of TD and MD relaxation, the heat-setting temperature and the relaxation temperature used in these examples are reported in Table 3.

The dimensional stability of these PET films is also reported in Table 3 and illustrates that by manipulating the amounts of TD and MD relaxation, the dimensional stability of the PET can be tailored to a desired level.

TABLE 3

| Example | Initial TD Stretch Ratio | % TD Relaxation | Final TD Stretch Ratio | Initial MD Stretch Ratio | % MD Relaxation | Final MD Stretch Ratio | Heat-Set/Relaxation Temperature (°C.) | 150° C. Shrinkage (MD/TD) (%*) |
|---|---|---|---|---|---|---|---|---|
| Control | 3.50 | 0 | 3.50 | 3.50 | 0 | 3.50 | 230/230 | 2.02/1.93 |
| 5 | 3.50 | 2 | 3.43 | 3.50 | 2 | 3.43 | 230/200 | 0.73/0.07 |
| 6 | 3.50 | 3 | 3.40 | 3.50 | 3 | 3.40 | 230/200 | 0.40/−0.13 |
| 7 | 3.50 | 4 | 3.36 | 3.50 | 2 | 3.43 | 230/200 | 0.06/0.32 |
| 8 | 3.50 | 4 | 3.36 | 3.50 | 4 | 3.36 | 230/230 | 0.89/−0.35 |
| 9 | 3.50 | 4 | 3.36 | 3.50 | 4 | 3.36 | 230/200 | 0.16/0.02 |

*(−) indicates expansion

What is claimed is:

1. An improved process for preparing a dimensionally stable, biaxially stretched polyethylene naphthalate film comprising the steps of:
   (a) casting a molten polyethylene naphthalate polymer onto a quenching surface and cooling the polymer to form a self-supporting film;
   (b) transporting the polyethylene naphthalate film into a tenter frame and gripping the edges of the film with tenter clips driven by linear electric motors;
   (c) preheating the polyethylene naphthalate film to an orientation temperature of from 115° to 165° C. in a preheating section of the tenter frame;
   (d) simultaneously stretching the polyethylene naphthalate film biaxially from 2.5 to 5.0 times its original dimensions in both the machine direction (MD) and transverse direction (TD) at a temperature of from 115° to 165° C. to form a biaxially stretched polyethylene naphthalate film; and (e) heat-setting the polyethylene napthalate film, wherein the improvement comprises simultaneously or sequentially relaxing the polyethylene naphthalate film from 2 to 5% in the machine (MD) and transverse (TD) directions by converging the paths of the tenter clips and decelerating the tenter clips during and/or after heat-setting at a temperature of from 185° to 260° C. wherein the biaxially stretched polyethylene naphthalate film has a thermal shrinkage of less than 0.30% measured in both the MD and the TD after exposure of the film to a temperature of 200° C. for 30 minutes.

2. An improved process for preparing a dimensionally stable, biaxially stretched polyethylene terephthalate film comprising the steps of:

(a) casting a molten polyethylene terephthalate polymer onto a quenching surface and cooling the polymer to form a self-supporting film;

(b) transporting the polyethylene terephthalate film into a tenter frame and gripping the edges of the film with tenter clips driven by linear electric motors:

(c) preheating the polyethylene terephthalate film to an orientation temperature of from 80° to 120° C. in a preheating section of the tenter frame:

(d) simultaneously stretching the polyethylene terephthalate film biaxially from 2.5 to 5.0 times its original dimensions in both the machine direction (MD) and transverse direction (TD) at a temperature of from 80° to 120° C. to form a biaxially stretched polyethylene terephthalate film; and (e) heat-setting the polyethylene terephthalate film, wherein the improvement comprises simultaneously or sequentially relaxing the polyethylene terephthalate film from 2 to 5% in the machine (MD) and transverse (TD) directions by converging the paths of the tenter clips and decelerating the tenter clips during and/or after heat-setting at a temperature of from 185° to 230° C. wherein the biaxially stretched polyethylene terephthalate film has a thermal shrinkage of less than 0.20% measured in both the MD and the TD after exposure of the film to a temperature of 150° C. for 30 minutes.

3. The process of claim 1 or 2 wherein the film is simultaneously stretched biaxially to form a film having a thickness of from 3.0 to 200 micrometers.

4. The process of claim 3 wherein the film is simultaneously stretched biaxially to form a film having a thickness of from 4 to 125 micrometers.

* * * * *